United States Patent
Tu et al.

[11] Patent Number: 6,001,745
[45] Date of Patent: Dec. 14, 1999

[54] METHOD FOR FORMING A VIA IN AN INTER METAL DIELECTRIC (IMD) CONTAINING SPIN ON GLASS (SOG)

[76] Inventors: Tuby Tu; Danny Wu; Kuang-Chao Chen, all of No. 1, Creation Rd. 1, S.B.I.P., Hsin-Chu, Taiwan

[21] Appl. No.: 09/059,366

[22] Filed: Apr. 14, 1998

[30] Foreign Application Priority Data

Nov. 15, 1997 [TW] Taiwan .................... 861 11 7066

[51] Int. Cl.[6] .................................................. H01L 21/316
[52] U.S. Cl. .................. 438/782; 438/640; 438/632; 438/624; 438/780; 438/790; 438/673
[58] Field of Search ............. 438/713, 780–782, 438/787–790, 673, 640, 624, 637, 631–632, 699

[56] References Cited

U.S. PATENT DOCUMENTS

| | | | |
|---|---|---|---|
| 5,429,990 | 7/1995 | Liu et al. | 438/624 |
| 5,457,073 | 10/1995 | Ouellet | 438/624 |
| 5,472,825 | 12/1995 | Sayka | 430/311 |
| 5,496,776 | 3/1996 | Chien et al. | 438/624 |
| 5,607,880 | 3/1997 | Suzuki et al. | 438/624 |
| 5,883,001 | 3/1999 | Jin et al. | 438/624 |
| 5,892,269 | 4/1999 | Inoue et al. | 257/634 |
| 5,893,750 | 4/1999 | Hause et al. | 438/633 |
| 5,898,221 | 4/1999 | Mizuhara et al. | 257/751 |
| 5,932,487 | 3/1999 | Lou et al. | 427/692 |

*Primary Examiner*—Chandra Chaudhari
*Assistant Examiner*—Thanh Nguyen
*Attorney, Agent, or Firm*—Bacon & Thomas, PLLC

[57] ABSTRACT

The present invention relates to a method for forming a VIA in an Inter Metal Dielectric (IMD) containing Spin On Glass (SOG). The IMD is formed by 1) depositing a first silicon dioxide layer through a Chemical Vapor Deposition (CVD) process; 2) depositing a Spin On Glass (SOG) layer; and 3) depositing a second silicon dioxide layer through a Chemical Vapor Deposition process. Afterward, before the VIA is formed by an Inter Metal Dielectric (IMD) etching process, a selective ion implantation process is performed to densify the Spin On Glass(SOG) layer. By this arrangement, the outgassing effect of the Spin On Glass (SOG) during a subsequent metal deposition process can be therefore prevented.

6 Claims, 5 Drawing Sheets

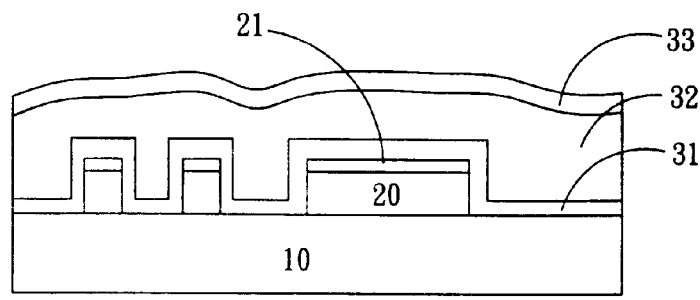
2A
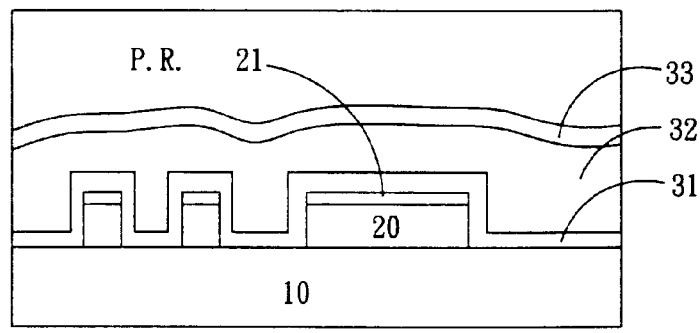
2B
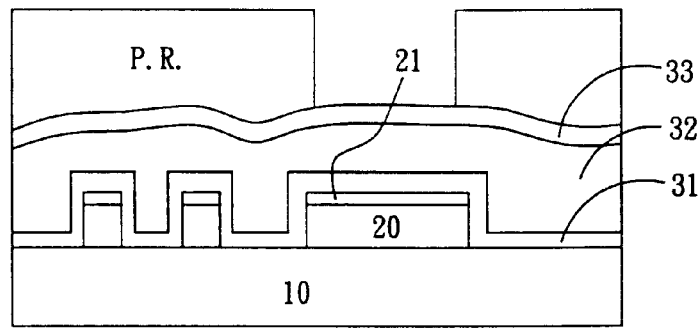
2C

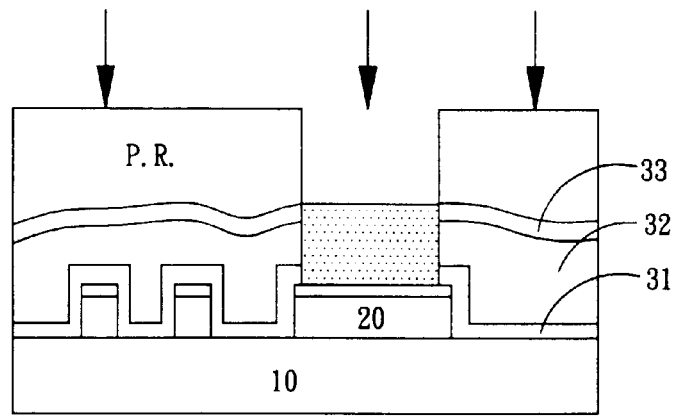
2D
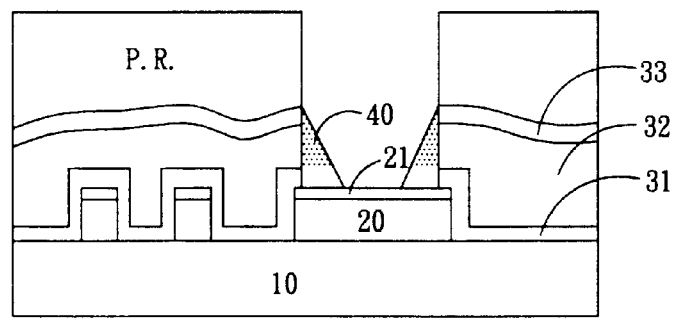
2E
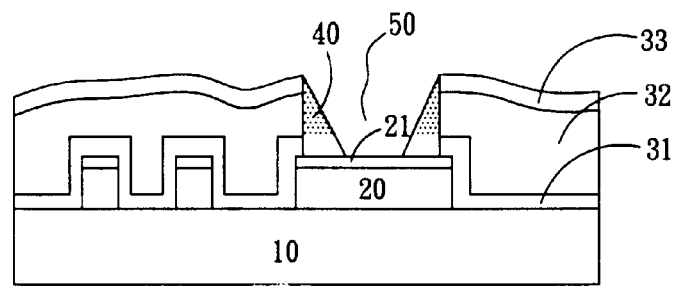
2F

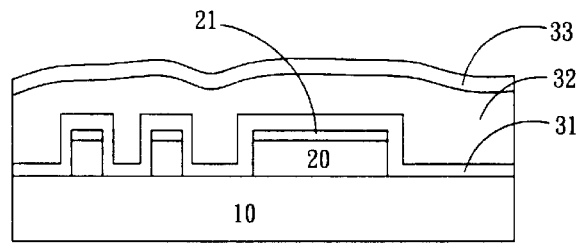
3A
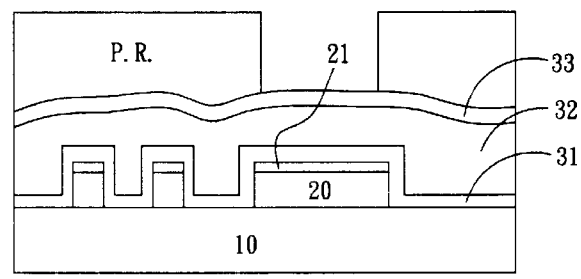
3B
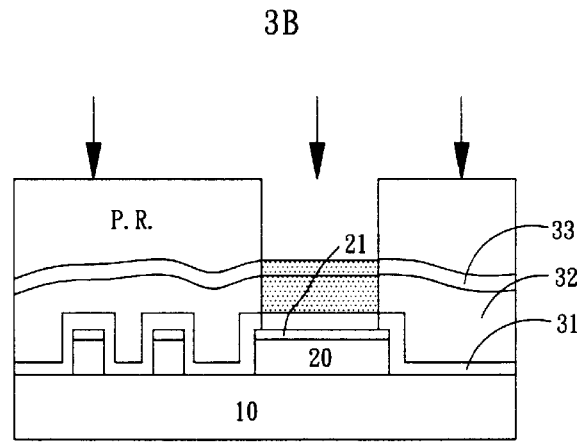
3C
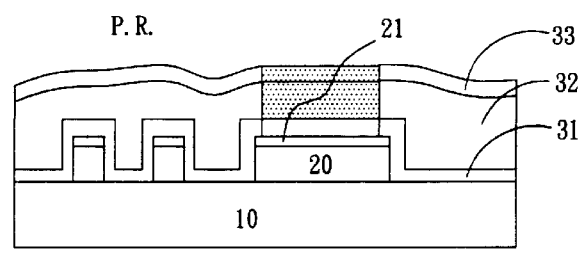
3D

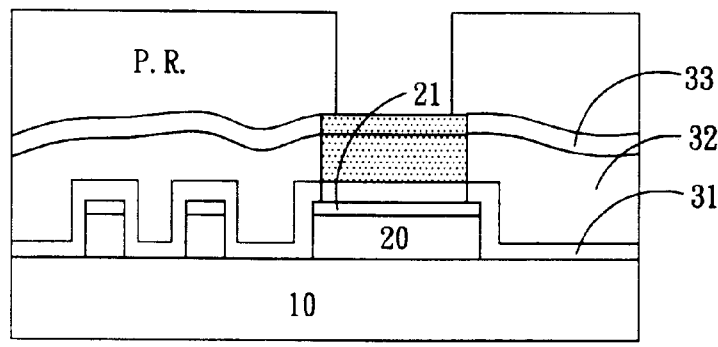
3E
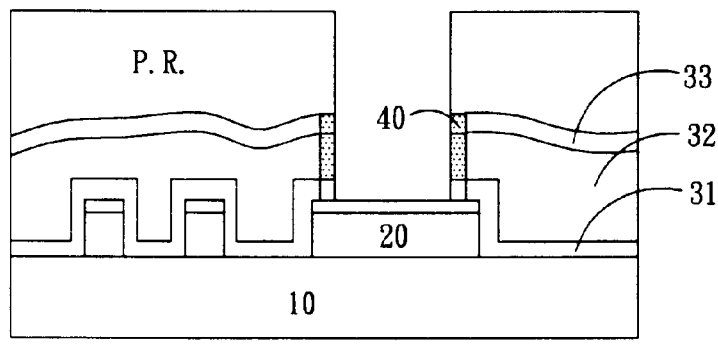
3F
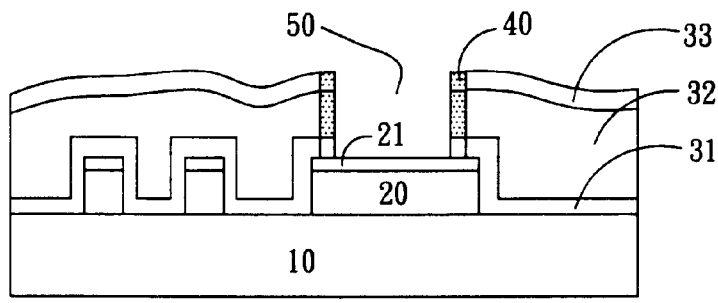
3G

METHOD FOR FORMING A VIA IN AN INTER METAL DIELECTRIC (IMD) CONTAINING SPIN ON GLASS (SOG)

FIELD OF THE INVENTION

The present invention relates to a method, more particularly, to a method for forming a VIA in Inter Metal Dielectric (IMD) containing Spin On Glass (SOG).

DESCRIPTION OF PRIOR ART

Since the dimension of the semiconductor device becomes smaller and smaller, right now, the technique has been advanced to the submicro meter level. However,in order to meet the requirements on high operating speed, and higher integration density, multilevel metal interconnect ions are employed to low the resitivity of interconnection layer. A metal layer has a thicker thickness and the patterns on the surface of the metal layer are uneven. After a plurality of metal layers are piled up,the unevenness of the surface of the metal layer become worse and worse. No doubt, the further processing, such as the depositing,lithography, etching, will be negatively influenced. In order to lover the negative influence, the Inter Metal Dielectric (hereinafter referred as IMD) , which is sandwiched between neighbor metal layers must have a better step coverage and easy to flat.

Right now, in order to provide a better step coverage and capability of being flattened, a Spin On Glass (hereinafter referred to as SOG) that has a capability of fluid characteristics liking a photoresist is applied. Accordingly, a flattening effect can be attained. However, the SOG is silicon dioxide that has poor quality and a plurality of impurities. Accordingly, this SOG layer can not be directly contact with the metal layer. Accordingly,before the SOG layer is employed, a layer of silicon dioxide having better quality, such as Chemical Vapor Deposition(hereinafter referred as CVD) layer shall be firstly deposited onto the metal layer to prevent the contamination from the SOG. Generally, the IMD features a sandwich configuration that includes CVD silicone oxide/SOG/CVD silicon oxide. However,as the SOG contains carbon and hydrogen radicals that tend to react with the oxygen.

$$CH_3+O_2 \rightarrow CO_2+H_2O$$

Accordingly, the SOG tends to absorb the humidity. As a result, an outgassing resulted from the absorbed humidity within the SOG will be experienced during a further metal deposition process. These outgassing will corrupt the metal lead within the VIA Besides, the attaching capability of the metal lead will also become poor. Consequently, the resistivity within the VIA increases. This is called a poission VIA, which results in a fail VIA. In the IMD configured by CVD silicon dioxide/SOG/CVD silicon dioxide, the SOG will be naked after the VIA is etched. This naked SOG tends to be damaged and formed a plurality of micro-recesses during the subsequent oxygen plasma etching that is used to remove the photoresist. Those micro-recesses will deteriorate the SOG outgassing and the poission VIA. Accordingly, the resistance value within the VIA is increased, and it can not meet the requirement for high operating speed.

The conventional method in Preventing or lowering the Poission VIA and micro-recesses is to avoid the SOG from being naked through the VIA. Then a method called partial etch back is applied to thin the SOG layer. As a result, the SOG outgassing can be softened. However, as the thickness of the SOG becomes thinner, the SOG at the corner of the metal pattern will become even thinner resulted from the step coverage effect. This will cause a short-circuit between two adjacent metal layers. Accordingly, it is the most important issue to overcome the above described problem.

SUMMARY OF THE INVENTION

It is the objective of this invention to provide a method for forming a VIA in Inter Metal Dielectric containing silicon on glass with which the Poission VIA can be reduced. In order to achieve the objective set forth, the IMD made according to the present invention is formed by 1) depositing a first thin silicon dioxide layer by using of a CVD process; 2) depositing a layer of silicate SOG; and 3) depositing a second thin silicon dioxide layer through CVD process. Afterward, before the VIA is etched,a selective ion etching process is conducted to densify the SOG. By this arrangement, the outgassing effect of the SOG during the subsequent metal deposition process at or adjacent the VIA can be therefore prevented.

BRIEF DESCRIPTION OF DRAWINGS

FIGS. 2A–2F are the cross sectional views of each of the processes in the first embodiment; and FIGS. 3A–3G are the cross sectional views of each of the processes in the first embodiment.

DETAILED DESCRIPTION OF PREFERRED EMBODIMENT

Figure 1:
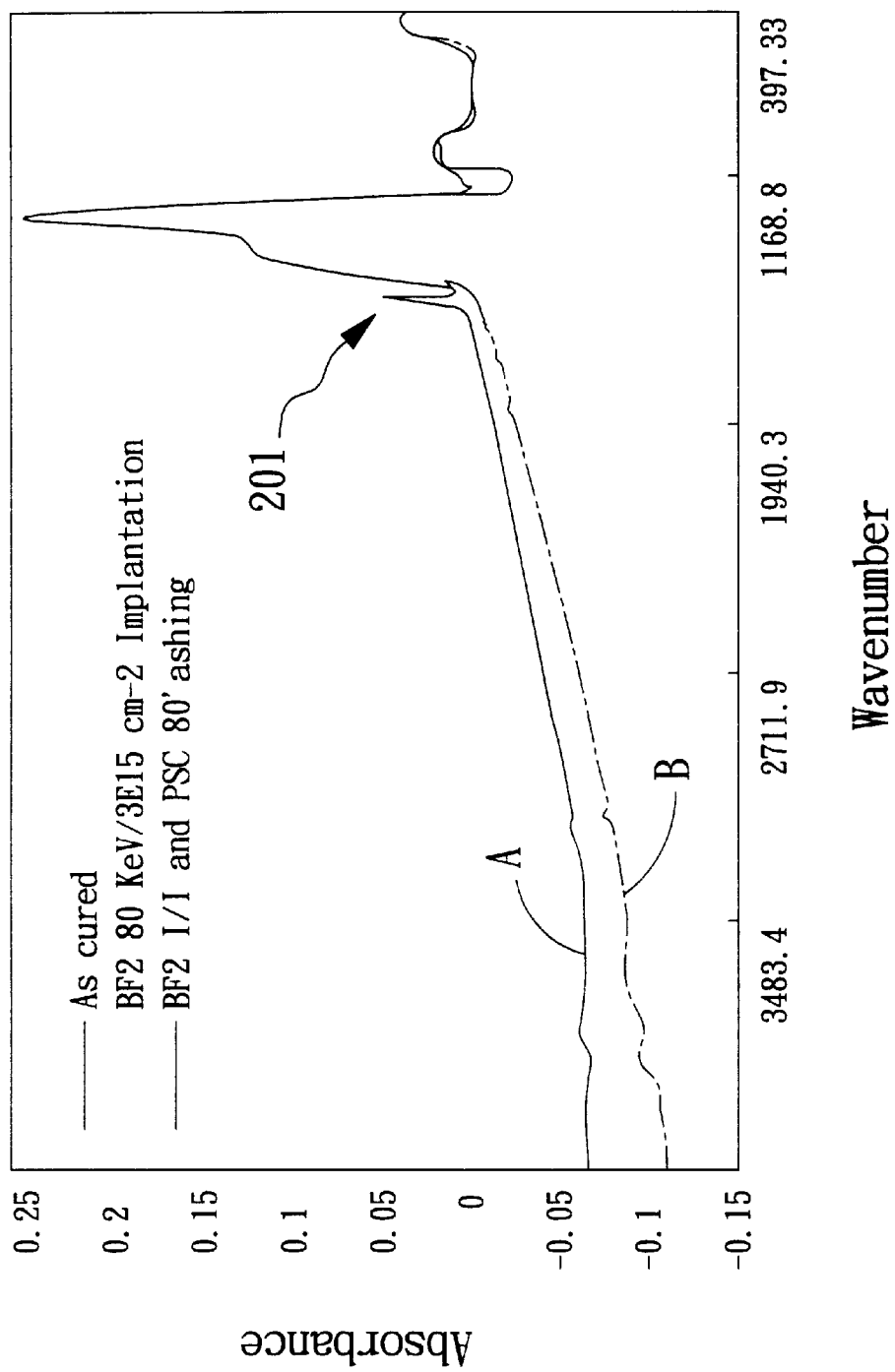
FIG. 1 is a chart of Fourier Transform Inferred Spectrum showing difference between SOG before and after the ion has been implanted.

The working principle of the present invention is to break the carbon and hydrogen radicals of the SOG by means of an ion implantation densification process. As a result, the humidity absorbing capability is considerably reduced, as clearly shown in FIG. 1. The upper curve A and lower curve B in FIG. 1 are the FTIR before and after the $BF_2$ ions are implanted respectively. In comparing those two curves, it can be readily found that the SOG at left side does not have small peak 201 because the implantation of the ions, i.e. as the carbon and hydrogen radicals have been broken the SOG thereof does not contain the Si—OH or $H_2O$. Accordingly, the SOG containing implanted ions will not release unwanted gas or humidity during the subsequent metal deposition process. The outgassing and poission VIA can be effectively reduced.

Referring to FIG. 2A, the silicon substrate 10 can be formed with transistor devices both on the surface and inside through conventional technique. No detailed description is given as it is known to the skilled in the art. The substrate 10 is further deposited with a metal layer and anti-reflective coatings These metal layers and coating are further processed with lithography, etching to form an uneven anti-reflective arranged and depends on the actual require ments. Afterward, the SOG 32 that has the photoresist is filled into the valley of the metal pattern such that the SOG can be provided with excellent step coverage and the flattening capability. As described above, the SOG 32 contains impurities that tend to contaminate the metal layer. Accordingly, the SOG layer is sandwiched by a first silicon dioxide 31 and a second silicon dioxide 33 through CVD processes. As, the SOG layer is suitably isolated, the metal layer will not be contaminated. The detailed structure of the IMD is shown in FIG. 2A.

As shown in FIG. 2B, the IMD layer is coated with a photoresist (P.R.). The IMD layer is Processed with lithography of the mask process, developing. Finally, the photoresist having VIA is formed, as clearly shown in FIG. 2C. Then an ion implantation process is conducted to implant the ions into the SOG that is not covered by the phtoresist. As a result,the SOG is densified. As shown in FIG. 2D, the darken area are the SOG that has been densified. Then, as shown in FIG. 2E, an etching process for forming turough hole is conducted. Subsequently, the etching process is conducted to the IMD that is configured with the second silicon dioxide 33/ SOG 32/first silicon dioxide 31. The etching process will be continued till the metal layer is reached. The etching for the through hole is also a taper etching because thereis remained IMD 40 within the through hole and that has a cone-shape. This IMD has been enclosed ant been densified. Then a process for removing and cleaning the photoresist is conducted. In the cleaning process, the photoresist is cleared by oxygen plasma and chemical liquid. Finally, a VIA hole 50 having taper shape is formed. This is the first embodiment of the present invention.

Since the IMD that contains SOG is covered by the IMD that has been densified, accordingly the SOG will not contact with the metal lead (not shown) within the VIA hole 50. As a result, the outgassing is suitably avoided. Besides, when the photoresist is removed by an oxygen plasma,the SOG is protected by the IMD that has been densified. Accordingly, there is no micro-recesses generated. In light of this, the poission VIA can be completely eliminated. Besides, the densified SOG is localized at the area in which the through hole is to form. Furthermore, the dielectric constant of the SOG will increase resulted from the ions implantation, the SOG located between the metal patterns still has lower dielectric constant. If the SOG located between the metal patterns has higher dielectric constant, the capacity of parasitic capacitor between the metal patterns will increase because the SOG has a higher dielectric constant. This will lower the operating speed. In light of this,the selectively implanted ions will not change the original lower dielectric constant of the SOG.

Referring to FIG. 3A that is similar to FIG. 2A, the silicon substrate 10 is formed with an anti-reflective layer 21 and a metal pattern 20. Again, the anti-reflective layer 21 is selectively arranged and can be omitted if requires. Afterward, an IMD configured by first silicon dioxide 31/SOG 32/second silicon dioxide 33 is deposited. This IMD is further treated with lithography, developing processes. Finally, a photoresist pattern similar to the VIA hole but having larger diameter is formed, as shown in FIG. 3B.

Then the IMD that has been treated ions implantation but not covered with photoresist is densified. Then the photoresist is removed similar to what disclosed in FIG. 3D. The VIA hole is then treated with lithograph, developing and finally a Photoresist that has VIA hole pattern is completed. Please note, the diameter of the photoresist in the area of the VIA hole is smaller than the diameter of the VIA hole during the densification process, as shown in FIG. 3F. Then the photoresist that contains VIA hole pattern is removed and the IMD 40 residues that has been densified is left on the sidewall of the IMD that has not been densified. The IMD 40 that has been densified forms the VIA hole 50, as shown in FIG. 3G. The second embodiment of the present invention is completed.

In comparing the first and second embodiments, the mask in the second embodiment has one more than the mask in first embodiment. On the other hand, the shape of the VIA hole is also different. However, both the first and second embodiments can effectively eliminate the poission VIA and the high metal resistance. The final result meets the requirements for high operating speeds Although the preferred embodiment of the invention has been disclosed for illustrative purposes, those skilled in the art will appreciate that various modifications, additions and substitutions are possible, without departing from the scope and spirit of the invention as disclosed in the accompanying claims.

What is claimed is:

1. A method for forming a VIA in an Inter Metal Dielectric containing Spin On Glass(SOG), comprising:

forming a metal layer on a silicon substrate;

performing lithography, developing, and etching processes on said metal layer to form a metal pattern;

depositing orderly a first silicon dioxide, SOG, and a second silicon dioxide to form an Inter Metal Dielectric structure;

performing lithography, developing to form a photoresist having a VIA pattern on said Inter Metal Dielectric structure; and etching said second dioxide, SOG, and first silicon dioxide and then removing said photoresist to form a VIA hole pattern;

characterized in that before said Inter Metal Dielectric structure is etched, an ions implantation process is performed to said Inter Metal Dielectric structure that is not covered by said photoresist, then said Inter Metal Dielectric structure that has been densified is performed with etching process such that a VIA hole having taper shape is formed.

2. A method for forming a VIA in an Inter Metal Dielectric containing Spin On Glass according to claim 1, wherein said silicon dioxide first silicon dioxide, and second silicon dioxide are formed by using a Chemical Vapor Deposition method.

3. A method for forming a VIA in an Inter Metal Dielectric containing Spin On Glass according to claim 1, wherein before said metal layer is deposited, an anti-reflective layer being deposited, and then said anti-reflective layer and said metal layer being performed with lithography, developing, etching such that an anti-reflective layer and metal pattern are formed.

4. A method for forming a VIA in an Inter Metal Dielectric containing Spin On Glass(SOG), comprising:

forming a metal layer on a silicon substrate;

performing lithography, developing, and etching processes on said metal layer to form a metal pattern;

depositing orderly a first silicon dioxide, SOG, and a second silicon dioxide to form an Inter metal Dielectric structure;

performing lithography, developing to form a photoresist having a VIA pattern on said Inter Metal Dielectric structure; and etching said second dioxide, SOG, and first silicon dioxide and then removing said photoresist to form a VIA hole pattern;

characterized in that the process of etching said Inter Metal Dielectric structure includes:

performing a lithography,developing on said Inter Metal Dielectric structure that has a larger diameter than said the VIA hole to form a photoresist having pattern;

performing an ions implantation onto said Inter Metal Dielectric structure that is not covered by said photoresist;

removing said photoresist having patterns, and forming a photoresist having the VIA hole pattern by means of through hole lithography, developing processes; and performing a taper etching to said Inter Metal Dielectric structure that has been densified, and finally a VIA hole having taper-shape is formed.

5. A method for forming a VIA in an Inter Metal Dielectric containing Spin On Glass according to claim 4, wherein said silicon dioxide, first silicon dioxide, and second silicon dioxide are formed by using a Chemical Vapor Deposition method.

6. A method for forming a VIA in an Inter Metal Dielectric containing Spin On Glass according to claim 4, wherein before said metal layer is deposited, an anti-reflective layer being deposited, and then said anti-reflective layer and said metal layer being conducted with lithography, developing, etching such that an anti-reflective layer and metal pattern are formed.

* * * * *